United States Patent [19]

Beng et al.

[11] Patent Number: 5,563,443

[45] Date of Patent: Oct. 8, 1996

[54] PACKAGED SEMICONDUCTOR DEVICE UTILIZING LEADFRAME ATTACHED ON A SEMICONDUCTOR CHIP

[75] Inventors: Lim T. Beng, Pasir Ris; Teo B. Ching, Mandarin Gardens, both of Singapore

[73] Assignee: Texas Instruments Incorporated, Dallas, Tex.

[21] Appl. No.: 476,996

[22] Filed: Jun. 7, 1995

Related U.S. Application Data

[62] Division of Ser. No. 107,101, Mar. 13, 1993.

[51] Int. Cl.$^6$ .................................................. H01L 23/495
[52] U.S. Cl. ........................... 257/666; 257/676; 257/692
[58] Field of Search ...................... 257/666, 691, 257/692, 676, 675, 690

[56] References Cited

U.S. PATENT DOCUMENTS

| | | | |
|---|---|---|---|
| 5,331,201 | 7/1994 | Nishino | 257/666 |
| 5,442,233 | 8/1995 | Anjoh et al. | 257/666 |

Primary Examiner—William Mintel
Assistant Examiner—Roy Potter
Attorney, Agent, or Firm—W. James Brady, III; Richard L. Donaldson

[57] ABSTRACT

A packaged integrated circuit (10) includes a leadframe adhesively attached onto a semiconductor IC chip (11). The leadframe includes a pair of bus bars or support ties (14, 15), a pair of support tabs (22, 23) and a plurality of lead fingers (12, 13) for inputting and outputting signals. The support ties (14, 15) extend outside of the integrated circuit package during formation of the package on one end of the package only with each tie extending outside the package on the opposite end of the other. The support tabs (22, 23) are positioned linearly from the support ties (14, 15) on the end of the package which the respective tie does not extend to the outside of the package. The leadframe and the IC chip are connected by a plurality of sheets of insulating tape (16, 17), which have a recess or removed portion (31) at the location closer to the support ties (14, 15), to reduce the risk of delamination of the insulating tape and to increase the reliability of the packaged IC. Also, support ties (14, 15) include extensions (45) which extend into gaps between the lead fingers (12, 13).

6 Claims, 3 Drawing Sheets

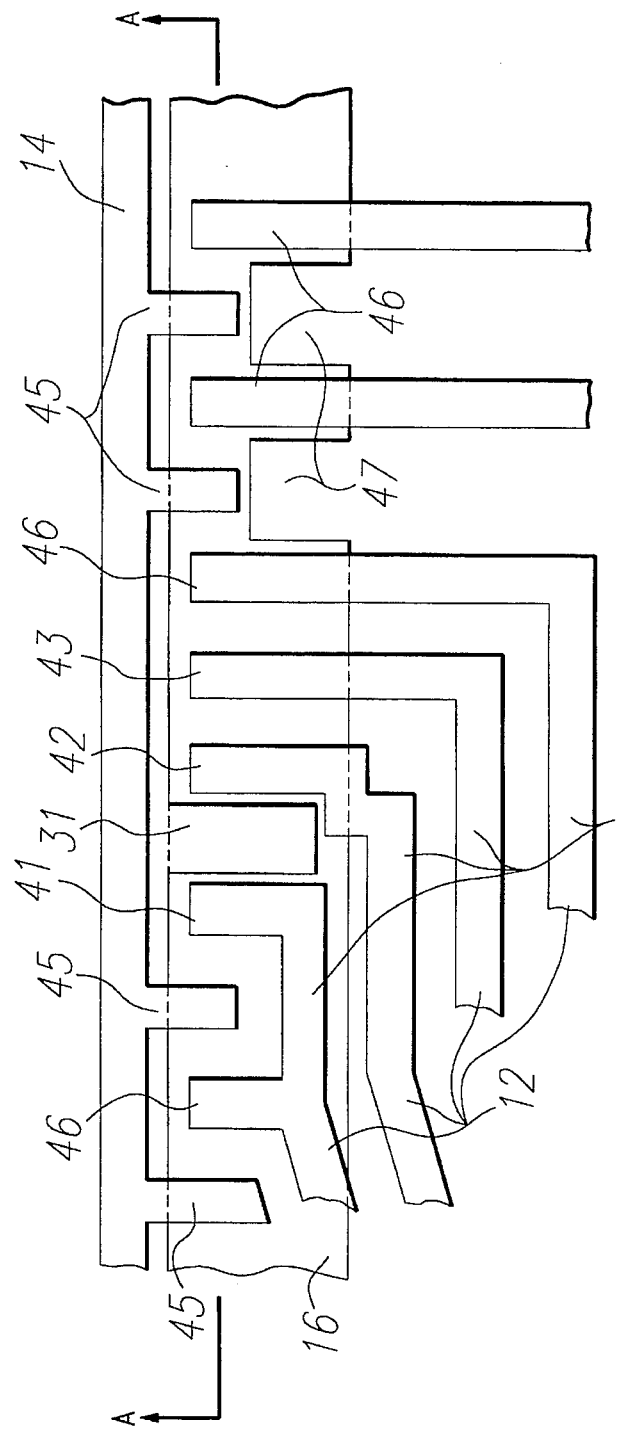
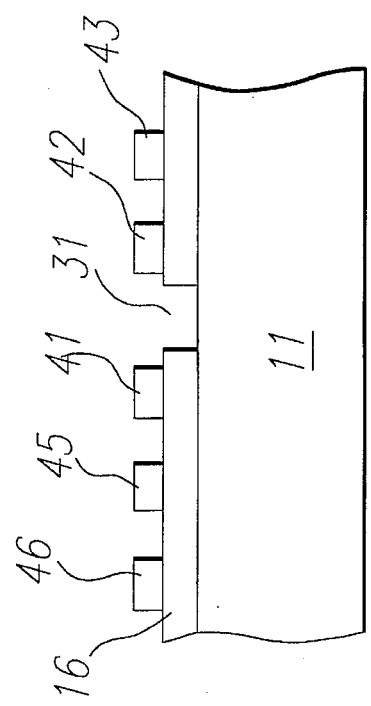

PACKAGED SEMICONDUCTOR DEVICE UTILIZING LEADFRAME ATTACHED ON A SEMICONDUCTOR CHIP

This is a division of application Ser. No. 08/107,101, filed 03/13/93.

FIELD OF THE INVENTION

This invention relates to packaged integrated circuits and more particularly to large scale semiconductor integrated circuits encapsulated in the plastic mold together with a leadframe with a plurality of electrically conductive leads, a part of which are located on a surface of the semiconductor integrated circuit chip.

BACKGROUND OF THE INVENTION

The technique of the semiconductor integrated circuit in a package having a plurality of leads located on a surface of a semiconductor chip or substrate, is sometimes called as "lead-on-chip" or "lead-over-chip" (LOC) technology. This type of technology has been discussed in several references, such as:

U.S. Pat. No. 4,916,519 (Ward) Issued Apr. 10, 1990

U.S. Pat. No. 5,068,712 (Murakami et al.) Issued Nov. 26, 1991 (corresponding to Japanese Kokai H2-246125)

U.S. Pat. No. 5,115,298 (Loh) Issued May 19, 1992.

In an integrated circuit using an LOC technology or in an LOC IC package, the bond pads of the integrated circuit may be positioned in the center of the chip, extending lengthwise. Commonly, the portions of the lead frame which provide power to the chip are formed as long "bus bars" extending the length of the chip on either side of the bond pads. Bond wires are attached connecting the bus bars to the appropriate bond pads using well known techniques such as ball bonding. The lead fingers for carrying the signals to the chip extend from the outside of the chip to the surface of the chip next to the bus bars. Bond wires are attached from these leads over the bus bars to the appropriate bond pads. To securely attach the portion of the lead frame where the bond wires are attached, a double sided adhesive tape is normally used to firmly attach the leadframe to a surface of a semiconductor chip. In addition, an insulative material may be applied to the surface of the bus bars, except where the bond wires are attached to the bus bar, to avoid shorting of the signal lead bond wires to the bus bars.

The lead frame usually includes support ties extending the length of the chip and which extend beyond the ends of the package during the mold injection process. These support ties provide mechanical support to the lead frame and the chip, onto which the lead frame is attached, during the mold injection process and during the lead trim and form process. Often, the support ties are formed integrally with the bus bars on the lead frame. The prior art support ties in prior art may cause warpage after the mold injection process due to the different expansion coefficients of the lead frame, the chip and the mold compound.

SUMMARY OF THE INVENTION

An embodiment of the present invention includes an integrated circuit device in a molded package. The integrated circuit includes bond pads thereon. A lead frame is attached to the surface of the integrated circuit. The lead frame includes at least two bus bars with one support tie each. The support ties extend beyond the package during the process for molding the package on one end of the package and but do not extending to the opposite edge of said package. The embodiment also includes an injected plastic encasing the integrated circuit and a portion of said lead frame to form the molded package.

BRIEF DESCRIPTION OF THE DRAWINGS

FIG. 4 is an expanded plan view of a part of the leadframe and the insulating tape shown in FIG. 2; and FIG. 5 is a cross-sectional view of a part of the leadframe and the insulating tape on the IC chip.

DETAILED DESCRIPTION OF THE SPECIFIC EMBODIMENT

Figure 1:
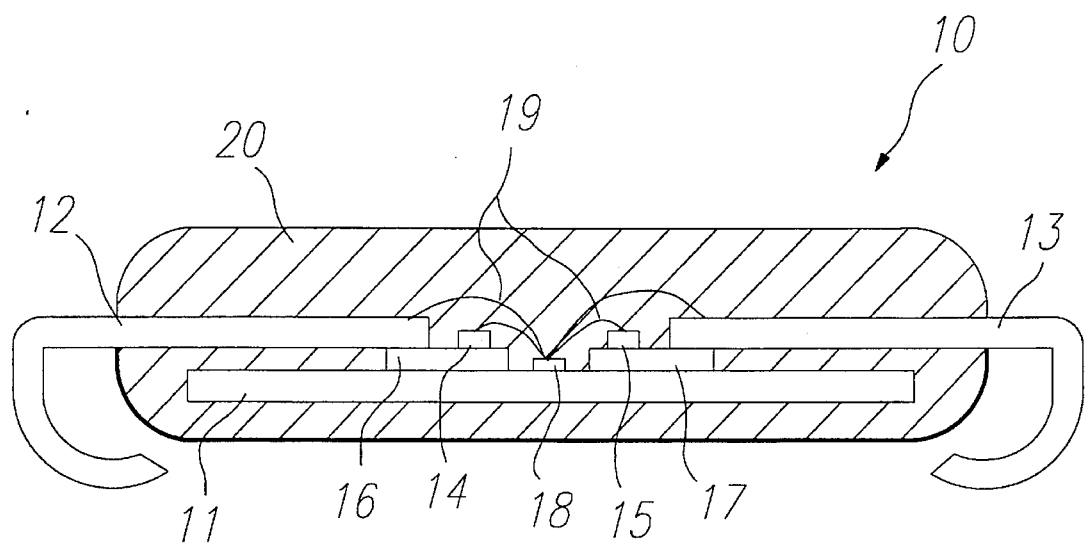
FIG. 1 is a cross-sectional view of an IC package.

FIG. 1 is a cross sectional view of an integrated circuit device 10, in an LOC package. In this embodiment, the overall package size is approximately 0.3 inches wide and 0.675 inches long. The IC device is, for example, a high density dynamic random access memory (DRAM). A semiconductor IC chip 11 is positioned below a leadframe, which has a plurality of lead fingers (12 and 13), and power supply leads or bus bars (14 and 15). IC chip 11 may have a width of 0.21 inches and a length of 0.352 inches, for example.

The lead frame consists of a stamped or etched frame formed from a suitably strong, malleable and conductive material such as an alloy of nickel and iron with a thickness in a range of approximately 0.005 to 0.010 inches. Although the present embodiment of the invention uses a lead frame made from an iron/nickel alloy, the advantages of the invention are even more pronounced when used with a material having a higher coefficient of exapansion than that of iron/nickel alloy. Materials with a higher coefficient of expansion will have a greater tendency to cause warping, cracking and delamination. The techniques of the present embodiment of the invention help minimize these effects.

Figure 3:
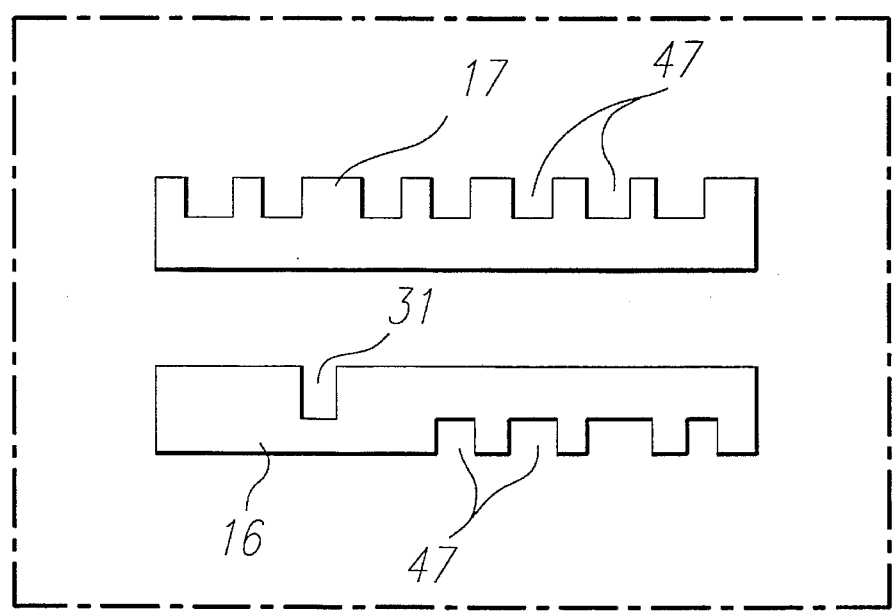
FIG. 3 is a plan view of the insulating tape used in the preferred embodiment of the present invention.
Figure 2:
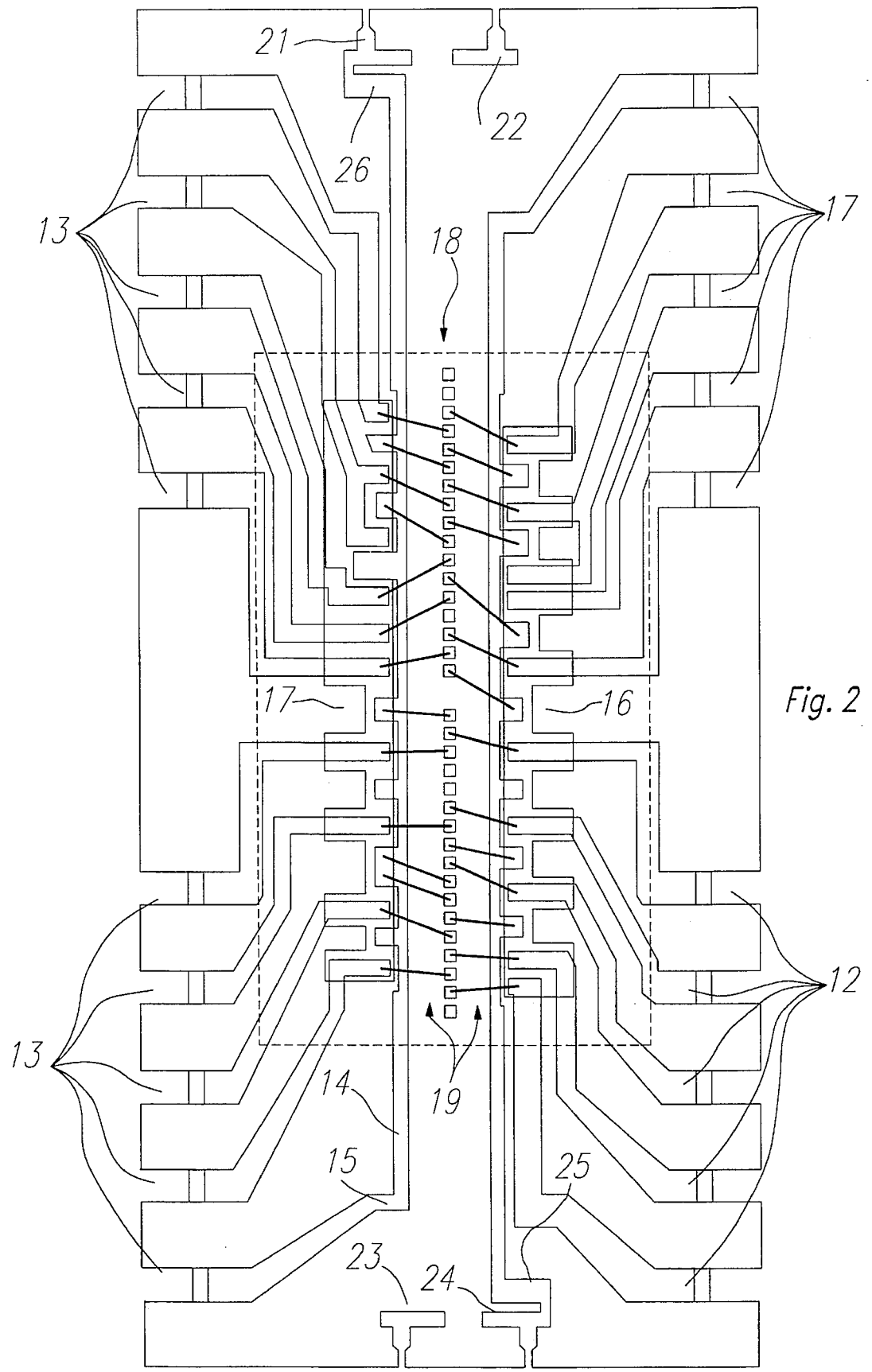
FIG. 2 is a plan view of leadframe and an insulating tape used in the preferred embodiment of the present invention.

Bus bars 14 and 15 may have a width of approximately 0.05 inches. Lead fingers 12 and 13 are attached to the semiconductor chip 11 by an adhesive insulating tape (or film) 16 and 17 located between lead fingers 12 and 13, bus bars 14 and 15 and the semiconductor chip 11. The outer portion of lead fingers 12 and 13 may have a width of 0.016 inches and the inner portion closest to buses 14 and 15 may have a width from 0.01 to 0.012 inches. The adhesive tape is a polyimide film or tape, such as Upilex (a brand name of Ube Corp.) which may have a thickness of approximately 0.002 inches, coated with an adhesive which responds to heat and pressure, such as thermoplastic or Himal (a brand name of Hitachi Chemical) which may have a thickness of approximately 10μm on both the top and bottom of the adhesive tape. The shape of insulating tapes 16 an 17 is illustrated in FIGS. 2 and 3. In this embodiment, insulating tapes 16 and 17 are approximately 0.035 inches wide and 0.185 inches long.

The semiconductor chip 11 has a predetermined number of bonding pads 18, according to the design of the device, approximately at the center of the chip 11, for receiving and supplying necessary voltages and signals. Conductive wires 19, such as gold wires, are connected between respective bonding pads 18 on the chip 11 and lead fingers (12 and 13)

at their inner lead portions using well know techniques such as ball bonding. Some bonding pads 18 are connected by conductive wires 19 to the power supply leads (bus bars) 14 and 15, which provide, for example, voltages of Vdd and Vss. Other conductive wires 19 are used to connect appropriate ones of bond pads 18 to lead fingers 12 and 13 and have various shapes of loops to run over bus bars 14 and 15. Bus bars 14 and 15 also serve as supporting ties in holding the chip to the lead frame in this embodiment.

An encapsulating material 20, such as a thermoset resin, is used for encapsulating the semiconductor chip 11, the leadframe (12, 13, 14 and 15 cumulatively), insulating tapes (16 and 17) and conductive wires 19. The outer portion of leads 12 and 13 are positioned outside of the encapsulating material 20, for electrically connecting the IC 11 to a printed circuit board (not shown). Support tabs 21, 22, 23 and 24 (FIG. 2) also extend outside the encapsulating material and hold the rest of the assembly to the rest of the lead frame during the lead trim and form process.

FIG. 2 shows a plan view of the leadframe and the insulating tapes shown in FIG. 1. The leadframe includes lead fingers 12 and 13 and bus bars 14 and 15, which also serve as power supply leads. The bus bars 14 and 15 are running generally in parallel along the length of the semiconductor chip 11, on either side of bonding pads 18. Lead fingers 12 and 13 have their inner portions positioned towards the bus bars 14 and 15 respectively. Those lead fingers are provided for inputting and outputting signals between the integrated circuit 11 and outside electrical devices. Of importance to the present invention, bus bars 14 and 15 only are connected to support tabs 24 and 21, respectively, on one of their ends and not to support tabs 22 and 23 on the opposite end from support tabs 24 and 21. The connection between the bus bars 14 and 15 is to support tabs which are on opposite ends of the package from each other (i.e. support tie 24 is on the opposite end of the package from support tie 21). Also, in the present embodiment, the bus bars 14 and 15 are connected to support tabs 24 and 21, respectively, by bends 25 and 26, respectively. Bends 25 and 26 provide additional stress relief but are not necessary for the practice of the invention.

Additional support for the lead frame during molding is provided by support tabs 22 and 23, which are placed in the general area opposite the end of bus bars 14 and 15, respectively, that are not connected to support tabs 24 and 21. Support tabs 24 and 21 and support tabs 22 and 23 extend beyond the IC package and provide support during the molding process. The portions of support tabs 24 and 21 and support tabs 22 and 23 which extend beyond the package are sheared off after the leads (the portion of lead fingers 12 and 13 extending beyond the encapsulating plastic 20, FIG. 1) are trimmed and formed. This support tie structure has been shown experimentally to significantly reduce warpage while providing good support during the molding, trimming and forming processes.

Lead fingers 12 and 13 have inner portions or inner tips of narrow and small areas of leads, located generally in parallel with each other and perpendicular to the bus bars 14 and 15. Central portions of lead fingers 12 and 13 have various shapes subject to the locations of bonding pads to be connected and the positions of outer parts of the lead fingers. In this embodiment, the some number of lead fingers 12 and 13 have their central portions which run parallel with the bus bars 14 and 15. Such a layout of lead fingers is often very helpful in minimizing the size of an integrated circuit package. The gaps between lead fingers at their central portions are narrower than the gaps between lead fingers at their inner portions (or inner tips).

The bus bars 14 and 15 are running generally in parallel except at their ends. In the present embodiment, the bus bars have several extensions towards and between the gaps of inner portions of lead fingers 12 and 13. Thus bus bars 14 and 15 have a comb shape.

The insulating films or tapes 16 and 17 are shown in FIG. 2 and more clearly in FIG. 3. Insulating tape 16 has a recess portion 31, formed by removing a part of insulating tape after placing insulating tape 16 on the chip, or so shaped prior to placement on the chip. The recess portion 31 is positioned between two inner portions or tip portions of lead fingers 12. This gap is used to avoid having a portion of insulating tape 16 between a large gap which prevent that portion of insulating tape 16 from receiving adequate pressure to insure good wetting or good adhesion. Recess portion 31 is shown as an example only and similar recesses may be positioned between other gaps between lead fingers which may occur.

In FIG. 4, a part of FIG. 2 is expanded for showing the lead fingers 12, bus bar 14 and the insulating tape 16. The recess portion 31 of the insulating tape 16 is positioned between two inner portions 41 and 42 of the lead fingers 12, where the gap between the inner portions 41 and 42 is wider that the gap between other inner leads, such as tips 42 and 43, for example. The recess portion 31 is made in a case the central portions 44 of lead fingers 12 are formed with a high density. In this embodiment, the gap between lead fingers at their central portions 44 is narrower than the gap between their inner portions 41 and 42, so that the recess portion 31 is positioned between inner portions 41 and 42 at the inner edge of the tape 16. The other recess portions (or removed portion) 47 can be formed at the outer edge of the tape 16. (See FIG. 3 also.) In the case where there are several pairs of inner portions of lead fingers with a similar gap, a plurality of recess portions can be made and positioned at those gaps of inner lead portions at the both edges of the tapes 16 and 17.

FIG. 4 also shows a plurality of extensions 45 from bus bar 14 toward the gap portions between inner leads 46. The width of extensions may be substantially same as the width of the bus bar 14 or may be a different width, depending on the gap between lead fingers into which the extension will project. The extensions 45 are made continuously from the bus bar 14 by punching or some other lead frame fabrication technique. Also, extensions 45 are convenient points for the attachment of bond wires to bus bar 14. Because bus bar 14 no longer must be wide enough for bond wire attachment, the width of bus bar 14 can be made smaller and the tips of lead fingers 12 may be positioned closer to bond pads 18 (FIG. 1). This allows the use of shorter bond wires 19 (FIG. 1) which are less likely to make unwanted contact with other bond wires or unwanted portions of the lead frame.

FIG. 5 shows a cross sectional view at the location of A and A'in FIG. 4. It shows the semiconductor chip 11, the insulating tape 16 and lead fingers 12, at the location including the recess portion 31 of the insulating tape 16, a pair of lead fingers 41 and 42 near the recess portion 31, and one of extensions 45 of the bus bar 14. The upper and lower sides of the insulating tape are formed with adhesive layers to adhesively attach bus bar 14 to the surface of the chip 11. The surface of the chip 11 is normally covered by a protective coating of an insulating layer, such as silicon dioxide or polyimide to protect the circuits formed in the semiconductor substrate. In the embodiment, the chip 11 includes not only a semiconductor substrate with many circuits, but also a protective coating thereon and interconnection layers in the protective coating.

The removal of the insulating tape 16 at the recess portion 31, minimizes the risk of delamination of the insulating tape 16 near the bus bar 14, because, if the tape 16 existed at a location of wider gap between inner leads 41 and 42, the tape 16 would not receive adequate pressure and could delaminate from the surface of the chip 11 under extreme conditions. Such a delamination could reduce the reliability of the LOC package.

Not shown in the figures is a second insulating layer placed on the top surfaces of bus bars 14 and 15 except where bonding wires will attach to leads 14 and 15. This insulating layer helps prevent shorting to bus bars 14 and 15 of the bond wires 19 (FIG. 1) which connect leads 12 and 13 to appropriate bond pads 18 (FIG. 1). By removing insulating tape 16 beneath bus bars 14 and 15 except under extensions 45, the problem of inadequate wetting of insulating layer 16 beneath bus bars 14 and 15 is avoided. Also, by inserting extensions 45 into gaps between lead finger of leads 12 and 13, proper wetting of all of insulating layer 16 is insured and the reliability of the integrated circuit is enhanced, even if the layout of the lead fingers 12 and 13 is very crowded in a small package.

Because the area of the insulating tape 16 and 17 is minimized, the potential risk of the expansion of the tape 16 and 17 is also minimized, which minimizes the risk of package cracking during a moisture test and a high temperature solder reflow at a board assembly of the LOC packages.

While this invention has been described with reference to illustrated specific embodiments, this description is not intended to be considered in a limiting sense. Various other embodiments of the invention will be apparent to persons skilled in the art upon reference to this description. It is therefore contemplated that the appended claims will cover any such modifications of embodiments as fall within the true scope of the invention. For example, a single adhesive and insulating tape, layer or film can be used in stead of a laminated tape of insulating film and adhesive layers at its both surfaces and/or the insulating tape may be composed of several pieced of insulating tape. Also, the relative location of the chip 11 and leadframe can be reversed, where the IC chip is mounted on top of a plurality of lead fingers. In addition, although and LOC package is described other packaging type may advantageously use the invention, such as single line packages. Also, other suitable materials may be used for the lead frame such as copper or silver. The lead frame may be formed using support tabs or not and may be formed using bends in the support ties or not.

What is claimed is:

1. An integrated circuit device in a molded package comprising:

an integrated circuit device having bond pads thereon, said bond pads being arranged in a center portion of said integrated circuit device, a center line extending along said center portion and bisecting said integrated circuit device;

a lead frame attached to a surface of said integrated circuit device, said lead frame including first and second support ties, said first and second support ties extending the entire length of said integrated circuit device and positioned generally parallel to said center line, said first support tie extending beyond a first edge of said package through which said center line passes during the process for molding said molded package and not extending to a second edge of said molded package opposite from said first edge of said molded package, said second support tie extending beyond said second edge of said molded package during the process for molding said molded package and not extending to said first edge of said molded package; and injected plastic encasing said integrated circuit and a portion of said lead frame to form said molded package.

2. An integrated circuit device as in claim 1 further comprising bonding wires extending from said lead frame to said bond pads.

3. An integrated circuit device as in claim 1 wherein said lead frame comprises an iron alloy.

4. An integrated circuit device as in claim 1 wherein said lead frame further comprises first and second support tabs, said first support tab positioned along a line through the portion of said first support which is parallel to said center line but separated from said first support tie and extending through said second edge of said molded package, said second support tab positioned along a line through the portion of said second support tie which is parallel to said center line but separated from said second support tie and extending through said first edge of said molded package.

5. An integrated circuit device as in claim 1 wherein said support ties are connected to at least one of said bond pads by a bond wire.

6. An integrated circuit device as in claim 1 wherein said support ties include bends.

* * * * *